United States Patent [19]
Takahashi et al.

[11] Patent Number: 6,095,396
[45] Date of Patent: Aug. 1, 2000

[54] BONDING LOAD CORRECTION METHOD AND WIRE BONDING APPARATUS

[75] Inventors: Kuniyuki Takahashi, Musashimurayama; Hijiri Hayashi, Nakano-Ku, both of Japan

[73] Assignee: Kabushiki Kaisha Shinkawa, Tokyo, Japan

[21] Appl. No.: 09/073,631

[22] Filed: May 6, 1998

[30] Foreign Application Priority Data

May 7, 1997 [JP] Japan .................................... 9-132844

[51] Int. Cl.[7] .............................. B23K 37/00; B23K 1/06; B23K 5/20
[52] U.S. Cl. ........................... 228/4.5; 228/102; 228/111; 228/1.1
[58] Field of Search ................. 228/102, 110.1, 228/111, 1.1, 4.5

[56] References Cited

U.S. PATENT DOCUMENTS

| | | | |
|---|---|---|---|
| 5,044,543 | 9/1991 | Yamazaki et al. | 228/110 |
| 5,060,841 | 10/1991 | Oshima et al. | 228/102 |
| 5,156,320 | 10/1992 | Yanagida | 228/102 |
| 5,176,310 | 1/1993 | Akiyama et al. | 228/179 |
| 5,443,200 | 8/1995 | Arikado | 228/102 |
| 5,501,388 | 3/1996 | Takeuchi | 228/1.1 |
| 5,566,876 | 10/1996 | Nishimaki et al. | 228/102 |

*Primary Examiner*—Patrick Ryan
*Assistant Examiner*—Cecilia Newsome
*Attorney, Agent, or Firm*—Koda & Androlia

[57] ABSTRACT

A wire bonding method and apparatus using a computer that has a memory which stores correction values that correct positional discrepancies in the height position of a bonding arm and limit values that limit an electric power not only in a state in which no load is applied but also in a state in which a weight is mounted on a supporting frame so that a load equal to a bonding load is applied to a linear motor that raises and lowers the bonding arm.

1 Claim, 3 Drawing Sheets

FIG. 3
PRIOR ART
(a) 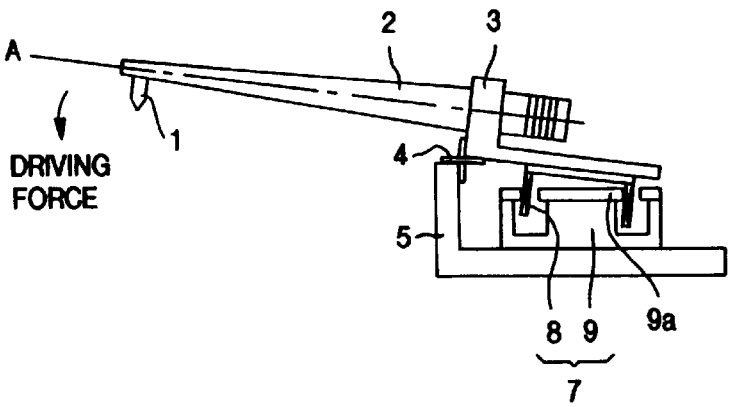
(b) 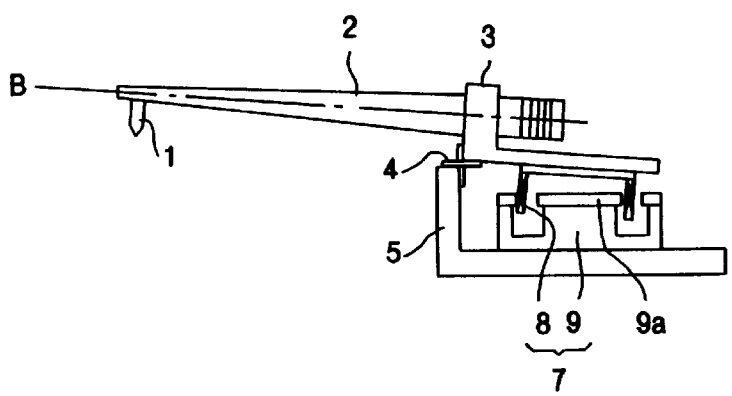
(c) 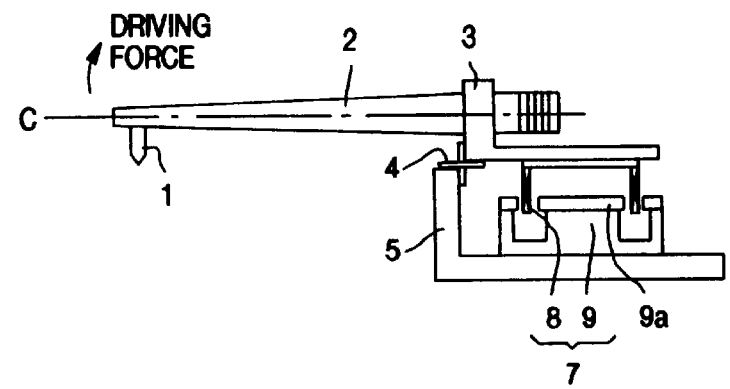
(d) 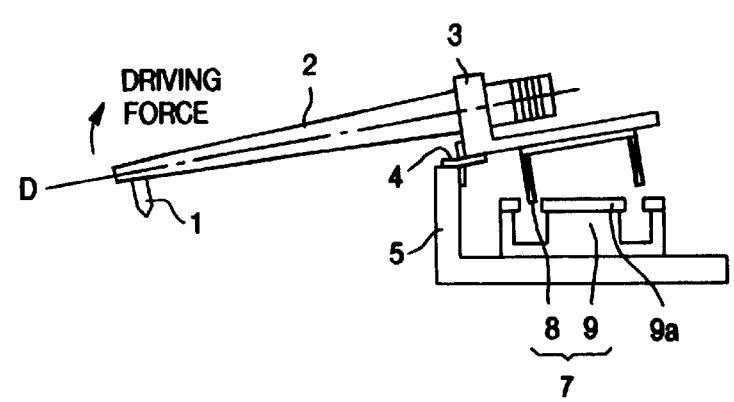

BONDING LOAD CORRECTION METHOD AND WIRE BONDING APPARATUS

BACKGROUND OF THE INVENTION

1. Field of the Invention

The present invention relates to a bonding load correction method and a wire bonding apparatus which includes a bonding arm movable upward and downward by an elastic member.

2. Prior Art

A wire bonding apparatus in which the bonding arm is supported so that the bonding arm is moved upward and downward and driven by an elastic member is shown in FIG. 2.

The bonding arm 2 of this bonding apparatus has a bonding tool 1 at one end thereof and is fastened to one end of a supporting frame 3. The supporting frame 3 is attached to a moving table 5 via a plate spring 4 which is assembled in the form of a cross, so that the supporting frame 3 is swingable upward and downward as shown by an arrow V, and a moving table 5 is mounted on an XY table 6. The coil 8 of a linear motor 7 is fastened to another end of the supporting frame 3, and the magnet 9 of this linear motor 7 is fastened to the moving table 5. A linear scale 10 is mounted to the rear end (right-side end in FIG. 2) of the supporting frame 3, and position detecting section 13 that comprises a position sensor 11 and an encoder 12 is fastened to the moving table 5 so that the position sensor 11 faces this linear scale 10. The wire bonding apparatus further includes a heating block 15 which heats a workpiece (not shown), and this heating block 15 is raised and lowered by a raising-and-lowering mechanism 16.

Examples of a wire bonding apparatus of this type are described in Japanese Patent Application Pre-Examination Publication (Kokai) Nos. S58-184734 and H6-29343 and Japanese Examined Patent Application Publication (Kokoku) No. H6-80697.

With the structure described above, the supporting frame 3 and bonding arm 2 are caused to swing in the direction of arrow V about the plate spring 4 by the linear motor 7, and the bonding tool 1 is thus moved up and down. Furthermore, the moving table 5, supporting frame 3, bonding arm 2 and bonding tool 1 are moved in the horizontal (or X and Y) direction by the XY table 6. By way of a combination of the vertical movement and horizontal movement of the bonding tool 1, a wire (not shown) passing through the bonding tool 1 is connected between a first bonding point and a second bonding point on the workpiece (not shown). In other words, a ball formed at the tip end of the wire is bonded to the first bonding point, and the other portion of the wire is bonded to the second bonding point. During bonding of the wire to the first bonding point and second bonding point, a load or a bonding load is applied by the linear motor 7 so that the ball or wire is pressed against the bonding point on the workpiece by the bonding tool 1.

Next, the operation system for the above bonding apparatus and the control configuration of the linear motor 7 will be described. The operation system substantially comprises an external input-output means 20 and a computer 21.

The external input-output means 20 performs input-output of various types of information (required for the operation of the apparatus) with respect to the computer 21. This may be accomplished by manual operation or by operation based on on-line communication with external devices.

The computer 21 comprises a control circuit 22, an operating circuit 23, a reference coordinate register 24, a load limit value register 25 and a height position counter 26. The control circuit 22 controls the external input-output means 20, operating circuit 23, reference coordinate register 24, load limit value register 25 and height position counter 26.

In the reference coordinate register 24, the height position of the bonding arm 2 is stored. The value of the height position is inputted into a position control circuit 31 of the position control section 30 as one position command. When the value is inputted, the position control circuit 31 compares a previous position command and a new position command and generates an amount of movement of the bonding tool from the difference between the two position commands. This amount of movement is transmitted to a motor driver 33 of the position control section 30 as a driving signal 32.

In the load limit value register 25, a value which indicates the upper limit (value) of the bonding load is stored, and the load limit value register 25 transmits such a value to the motor driver 33 as limit information 27. The motor driver 33 generates electric power which is used to move the bonding tool 1 to the designated height position in accordance with the driving signal 32 and at the same time acts so as to limit the electric power in accordance with the limit information 27 so that the upper limit value of the bonding load is not exceeded. Generally, electric power is the product of voltage and current; therefore, actual control of the linear motor 7 can be accomplished by controlling either the voltage or current, or both. Accordingly, the following explanation describes the case where the driving current 34 (and not voltage) that flows through the linear motor 7 is controlled and the voltage value is fixed. The circuit described in Japanese Examined Patent Application Publication (Kokoka) No. H6-18222 may be cited as an example of the circuit that controls the driving current. When the driving current 34 generated by the motor driver 33 is applied to the coil 8 of the linear motor 7, a driving force is generated; and as a result of this driving force, the supporting frame 3, bonding arm 2 and bonding tool 1 are caused to swing about the plate spring 4.

Furthermore, the height position counter 26 of the computer 21 counts signals from an encoder 12 which converts signals from the position sensor 11 into a signal format which is suitable for being inputted into the computer 21 and generates an actual height position on the linear scale 10. The computer 21 is provided beforehand with the ratio of the amount of movement of the bonding tool 1 in the vertical direction to the amount of movement of the linear scale 10 in the vertical direction, and a quantization coefficient. Accordingly, the actual height position of the bonding tool 1 is determined by calculations performed (on the basis of the above-described value) by the operating circuit 23 on the value indicated by the height position counter 26. The term "height position of the bonding tool" refers to the height position at which the bonding tool 1 contacts the object to which a load is to be applied.

A bonding load calibration method within the bonding apparatus described above will be described.

First, a load cell 40 is placed on the heating block 15 so that the projecting part 41 (detection part) of the load cell 40 is positioned directly beneath the tip end portion of the bonding tool 1. This load cell 40 is connected to a load gauge 42, so that the load applied to the load cell 40 is constantly displayed by the load gauge 42. Next, the raising-andlowering mechanism 16 is operated so as to raise and lower the heating block 15 and load cell 40, and the bonding arm 2 is adjusted to a horizontal position.

The bonding arm 2 is adjusted horizontally because it is desirable that the undersurface of the bonding tool 1 which contacts the bonding point be parallel to the bonding surface during bonding. The bonding tool 1 is fastened to the bonding arm 2 at right angles to the direction of extension of the bonding arm 2, so that the bonding tool 1 faces directly downward. Furthermore, the bonding arm 2 and the bonding tool 1 swing about the plate spring 4. Accordingly, it is desirable that the bonding tool 1 be in a vertical position, i.e., that the bonding arm 2 be in a horizontal position, when the bonding tool 1 contacts the bonding point.

When the bonding arm 2 has thus been adjusted to a horizontal position, a command is sent to the computer 21 using the external input-output means 20 so that the bonding arm 2 is placed in a horizontal position. As a result of this command, the control circuit 22 sends control information for this purpose (horizontal positioning) to the position control circuit 31 via the reference coordinate register 24; and in addition, the control circuit 22 sends limit information 27 which is used to limit the driving current 34 to the motor driver 33. Furthermore, the position control circuit 31 sends a driving signal 32 which is used to generate a driving current 34 to the motor driver 33. On the basis of this driving signal 32, the motor driver 33 generates a driving current 34 of the specified polarity and magnitude and outputs this driving current 34 to the coil 8. However, in cases where the driving current 34 exceeds the upper limit value specified by the computer 21, the magnitude of the driving current 34 applied to coil 8 does not exceed the upper limit value.

Afterward, instructions concerning the movement of the bonding arm 2 are sent out from the computer 21 in the manner described above.

Next, when the bonding load (for instance 20 g) is set via the external input-output means 20, this load is applied to the load cell 40 as a result of the above-described operation. In this case, since the actual bonding load value is displayed by the load gauge 42 which is connected to the load cell 40, it is necessary to adjust the driving current 34 so that this value is equal to the set bonding load. The correspondence between the limit information 27 specified by the computer 21 and the value of the actually limited bonding load is thus altered by manual operation of the external input-output means 20. When the set bonding load agrees with the actual value of the bonding load displayed by the load gauge 42, the bonding load is set at a different value (for instance, 200 g), and then the above-described operation is repeated. In this way, the error between the set bonding load and the actual bonding load is minimized.

In the system wherein the supporting frame 3 is supported by a plate spring 4 so as to swing upward and downward as described above, when no driving current 34 flows through the coil 8 or when no driving force is generated in the linear motor 7, the bonding arm 2 stops at the equilibrium position B as shown in FIG. 3(b) which is between the driving force of the plate spring 4 and the weight balance of the bonding tool 1, bonding arm 2, supporting frame 3, coil 8 and linear scale 10, etc. supported by the plate spring 4. The driving force of the plate spring 4 in this case acts in a direction which causes the bonding arm 2 to return to the equilibrium position B.

More specifically, when the bonding arm 2 is in a position A which is higher than the equilibrium position B as shown in FIG. 3(a), a driving force which pushes the bonding arm 2 downward toward the equilibrium position B is generated. On the other hand, when the bonding arm 2 is in a position C or D lower than the equilibrium position B, as shown in FIG. 3(c) or 3(d), then a driving force which pushes the bonding arm upward toward the equilibrium position B is generated. The equilibrium position B varies according to the mechanical factors; therefore, the bonding arm 2 in the equilibrium position B is not necessarily to a horizontal position as shown in FIG. 3(c). Here, the term "mechanical factors" refers to mechanical errors arising from the working precision, assembly, adjustment, etc. of the parts that makes up the bonding head part.

As the bonding arm 2 is displaced toward the higher position A from the balance position B, the force with which the bonding arm 2 is pulled downward by the plate spring 4 increases, so that the driving force of the plate spring 4 is added to the original bonding load. Accordingly, there is a corresponding increase in the actual bonding load. Furthermore, as the bonding arm 2 is displaced downward toward the lower position C or D, the force with which the bonding arm 2 is pulled upward by the plate spring 4 increases, so that the original bonding load is canceled. Accordingly, there is a corresponding decrease in the actual bonding load. As seen from the above, the prior art system has a problem. In other words, as the height position of the bonding arm 2 is apart from the equilibrium position B determined by the plate spring 4, error between the set bonding load and the actual bonding load increases.

Furthermore, in the conventional bonding load calibration method, the set bonding load is merely adjusted with the height position of the bonding point set at the horizontal position C of the bonding arm 2; and absolutely no consideration is given to the relationship between the driving force of the plate spring 4 and the weight balance of the bonding tool 1, bonding arm 2, supporting frame 3, coil 8 and linear scale 10, etc., supported by the plate spring 4. In the mean time, the height of the bonding points of the workpieces to be bonded varies according to the type of workpiece involved; and even in the same workpiece, in some cases, the first and second bonding points have different heights. Accordingly, when bonding is performed at a position other than the equilibrium position B, a driving force is generated in the plate spring 4, and this driving force affects the bonding load, so that the actual bonding load differs from the set bonding load.

Furthermore, in the prior art described above, the load gauge 42 must be read by an attendant, and the actual bonding load must be adjusted by this attendant so that the bonding load is kept equal to the set bonding load. Accordingly, the problem of correction error caused by human factors arises.

SUMMARY OF THE INVENTION

The object of the present invention is to provide a bonding load correction method and bonding apparatus which is free from any correction error caused by mechanical or human factors and which make it possible to obtain an actual bonding load that is equal to the set bonding load regardless of the height position of the bonding point.

The method of the present invention that solves the problems described above is used in a wire bonding apparatus which includes a bonding arm which has a bonding tool at one end and is supported on a supporting frame driven by an elastic member so that the bonding arm can move upward and downward, a linear motor which drives the bonding arm upward and downward, a position detecting section which detects the height position of the bonding arm and converts the height position into an electrical signal, a computer which calculates the height position of the bonding arm and the limit value of the electric power applied to the linear motor by processing signals from the position detecting section, and a position control section which maintains the height position of the bonding arm and controls the movement of the bonding arm; and the method of the present invention is characterized in that the computer is stored with correction values that correct positional discrepancies in the height position of the bonding arm and limit values that limit the electric power not only in a state in which no load is applied but also in a state in which a weight is mounted on the supporting frame so that a load equal to the bonding load is applied to the linear motor, and the electric power applied to the linear motor is controlled according to the correction values and limit values during bonding, thus correcting the bonding load.

Furthermore, the apparatus of the present invention that solves the problems described above includes a bonding arm which has a bonding tool at one end and is supported on a supporting frame driven by an elastic member so that the bonding arm can move upward and downward, a linear motor which drives the bonding arm upward and downward, a position detecting section which detects the height position of the bonding arm and converts the height position into an electrical signal, a computer which calculates the height position of the bonding arm and the limit value of the electric power applied to the linear motor by processing signals from the position detecting section, and a position control section which maintains the height position of the bonding arm and controls the movement of the bonding arm; and the apparatus of the present invention is characterized in that the computer is provided with a memory which stores correction values that correct positional discrepancies in the height position of the bonding arm and limit values that limit the electric power not only in a state in which no load is applied but also in a state in which a weight is mounted on the supporting frame, thus applying a load equal to the bonding load to the linear motor.

BRIEF DESCRIPTION OF THE DRAWINGS

FIGS. 3(a)–3(d) are explanatory diagrams which illustrate the direction of the driving force according to the height position of the bonding arm.

DETAILED DESCRIPTION OF THE PREFERRED EMBODIMENTS

An embodiment of the present invention will be described with reference to FIGS. 1 and 3(a)–3(d). Constituting elements which are the same as those in FIG. 2 or correspond to those in FIG. 2 are labeled with the same symbols, and a detailed description of such elements is omitted.

Figure 1:
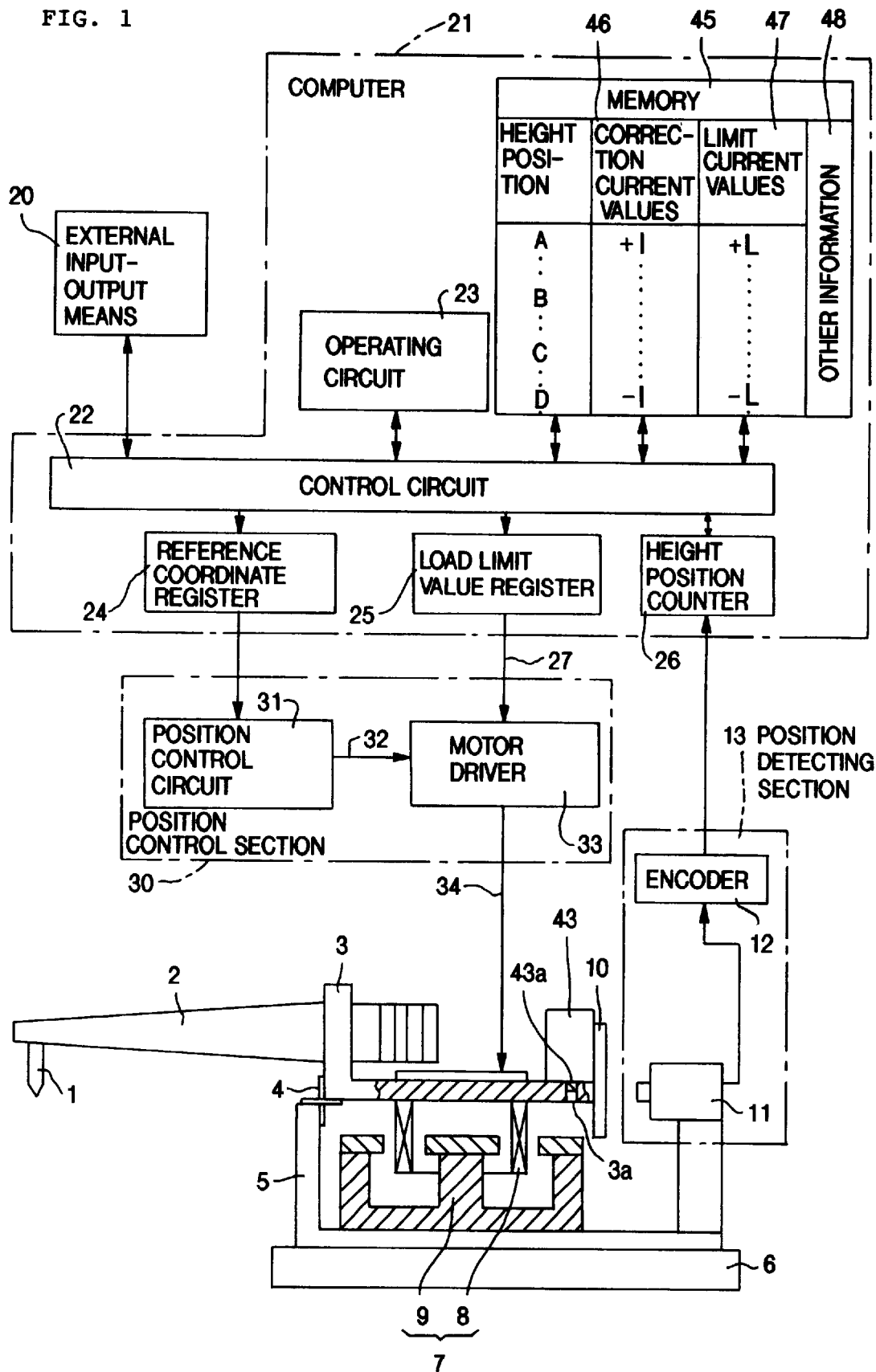
FIG. 1 illustrates one embodiment of the wire bonding apparatus of the present invention.
Figure 2:
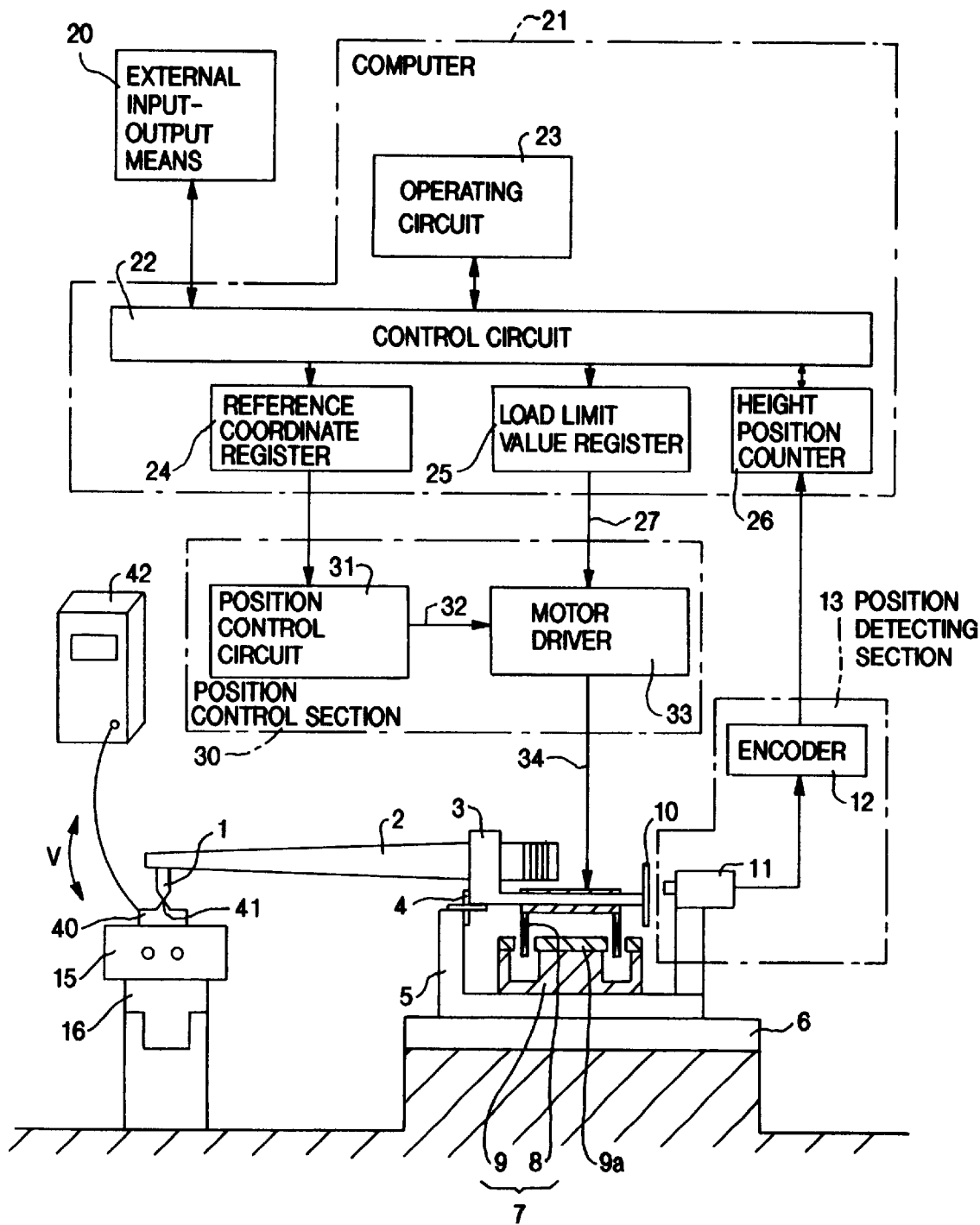
FIG. 2 shows a conventional wire bonding apparatus.

As shown in FIG. 1, one or a plurality of positioning holes 3a are formed in the rear end portion of the supporting frame 3, and positioning pins 43a of a weight 43 are mounted in these positioning holes 3a so that the positioning pins 43a can be removed from the positioning holes 3a. Here, the weight 43 is mounted in the positioning holes 3a so that no shift occurs in the position of the weight 43 even if the supporting frame 3 should tilt during the bonding load correction operation which will be described later. Since the positioning holes 3a and positioning pins 43a are to be engaged together, it would also be possible to install positioning pins on the supporting frame 3 (and not on the weight 43) and to form positioning holes 3a in the weight 43 (and not in the supporting arm 3).

The computer 21 is provided with a memory 45 in addition to a control circuit 22, an operating circuit 23, a reference coordinate register 24, a load limit value register 25 and a height position counter 26; and in this memory 45, correction current values 46, which are required in order to correct the variation in the driving force of the plate spring 4 according to the respective positions A, B, C and D of the bonding arm 2 shown in FIGS. 3(a)–3(d), limit current values 47 of the driving current 34, and other information 48 (including a ratio of the amount of vertical movement of the bonding tool 1 to the amount of vertical movement of the linear scale 10, quantizing coefficient for the position sensor 11, driving voltage of the linear motor 7, etc.) are stored.

The method for setting the correction current values 46 and limit current values 47 will be described below.

First, the relationship between the position of the coil 8 and the driving current 34 in the so-called "unloaded state" (state with no weight 43 attached), in which the load on the linear motor 7 is only the spring load of the plate spring 4 and the actual bonding load is 0 g, is investigated.

In this investigation, the bonding arm 2 is first moved to position A. shown in FIG. 3(a) and then stopped in this position. The driving force of the plate spring 4 in this case acts in the direction which pushes the bonding arm 2 downward, and the driving force generated by the coil 8 is an equal force which is sufficient to cancel the driving force of the plate spring 4. The limit value of the bonding load (i.e., the value stored in the load limit value register 25) is set at a value which has a certain margin (as a result of the upper limit value being raised to some extent), so that a driving current 34 which is capable of canceling the driving force of the plate spring 4 is caused to flow to the coil 8.

Next, the limit value (absolute value) of the driving current 34 is gradually lowered. As a result, the driving current 34 decreases so that at some point the driving force generated by the coil 8 drops below the driving force of the plate spring 4, thus lowering the height position of the bonding arm 2. The height position immediately prior to this lowering and the corresponding limit value of the driving current 34 are stored in the memory 45 of the computer 21. The limit value stored as a result of this procedure is a value that corresponds to the amount of driving current 34 which generates a driving force for canceling the driving force of the plate spring 4.

Next, the bonding arm 2 is moved to position D shown in FIG. 3(d) and is stopped in this position. Then, in the same manner as described above, the limit value of the driving current 34 is gradually lowered. Consequently, at a certain point, the height position of the bonding arm 2 is raised. The height position immediately prior to this raising and the corresponding limit value of the driving current 34 are stored in the memory 45.

The above-described investigation is performed for a plurality of positions, and values for locations between these positions are determined by a linear interpolation performed by the operating circuit 23. In this way, the basic amount of current required to cancel out the driving force of the plate spring 4 can be determined from the set bonding height position. The amount of current obtained by adding the current corresponding to the set bonding load (i.e., the actual bonding current) to this basic amount of current is the amount of driving current 34 that is actually applied to the coil 8. In other words, since the driving force of the plate spring 4 for each set height position is canceled out, a bonding load which is equal to the set value is obtained regardless of the height position. Furthermore, since no correction error caused by mechanical or human factors is involved, a reliable correction can be performed. Here, points A, B, C and D indicate the respective positions shown in FIGS. 3(*a*), 3(*b*), 3(*c*) and 3(*d*).

In a case where the bonding load applied to the bonding point during bonding is, for instance 60 g, a weight 43 constituting a load equal to the load that is generated in the linear motor 7 when a bonding load of 60 g is applied to the bonding point is mounted in the positioning holes 3*a* of the supporting frame 3. In a case where the ratio of the distance between the plate spring 4 (which constitute the swinging fulcrum of the bonding arm 2) and the bonding tool 1 to the distance between the plate spring 4 and the center of gravity of the weight 43 (when such a weight 43 is mounted on the supporting frame 3) is for example 4:3, then a weight 43 which has a weight of (4/3)×60 g=80 g is mounted.

When the weight 43 is thus mounted, the coil 8 is lowered, and the amount of vertical movement of the linear scale 10 in this case is read by the position sensor 11, so that the value of the height position counter 26 inputted via the encoder 12 can change. Then, a driving signal 32 is inputted to the motor driver 33 by the external input-output means 20 via the control circuit 22, reference coordinate register 24 and position control circuit 31; and a driving current 34 is applied to the linear motor 7 via the motor driver 33 so as to actuate the linear motor 7, thus causing the bonding arm 2 to be raised or lowered so that the value of the height position counter 26 is set at the unloaded value. The value of the driving current 34 in this case is stored in the memory 45 as the load correction value. Afterward, the weight 43 is removed from the supporting frame 3. In other words, when a bonding load is applied, the correction current value 46 for the unloaded state is corrected by the load correction value of the driving current 34.

Thus, during actual bonding operations, a driving current 34 is applied to the linear motor 7 in accordance with the height position of the bonding arm 2. Such a driving current 34 is obtained by adding the driving current in the case of bonding load applied (i.e., when the weight 43 is mounted) to the driving current which is based on the correction current value 46 in the case of no bonding load applied.

In the above embodiment, the invention is applied to a structure in which the supporting frame 3 is supported by plate spring 4 so that the supporting frame 3 can swing upward and downward. However, the present invention is not limited to this structure. The present invention is applicable to cases where a motor installed on the bonding head (moving table) is used instead of the linear motor in a structure in which a tool arm (bonding arm) is fastened to an arm holder (supporting frame) which is raised and lowered with a supporting shaft as a fulcrum and is driven by a spring, as described in Japanese Patent Application Pre-Examination Publication (Kokai) No. H4-352336. More specifically, the stopping position of the tool arm (bonding arm) is caused to shift by the driving force of the spring in cases where the coil of a linear motor is fastened to the arm holder (supporting frame) and the magnet of the linear motor is fastened to the bonding head (moving table); accordingly, the present invention can also be applied to such a structure.

As seen from the above, according to the present invention, correction values that correct positional discrepancies in the height position of the bonding arm and limit values that limit the electric power not only in a state in which no load is applied but also in a state in which a weight is mounted on the supporting frame so that a load equal to the bonding load can be applied to the linear motor are stored in a computer, and the electric power is controlled according to these correction values and limit values during bonding, thus correcting the bonding load. Accordingly, no correction error caused by mechanical factors or human factors will occur, and it is possible to obtain an actual bonding load that is equal to the set bonding load regardless of the height position of the bonding point.

What is claimed is:

1. A bonding load correction method for a wire bonding apparatus comprising: a bonding arm, a bonding tool at one end of said bonding arm, a supporting frame having the bonding arm provided thereon, a supporting table, an elastic member coupling together said supporting frame and table so that said bonding arm can move upward and downward, a linear motor which drives said bonding arm upward and downward, a position detecting section which detects a height position of said bonding arm and converts said height position into an electrical signal, a computer which calculates said height position of said bonding arm and a limit value of an electric power applied to said linear motor by processing signals from said position detecting section, and a position control section which maintains said height position of said bonding arm and controls movement of said bonding arm; said method being characterized in that said bonding arm is moved to a plurality of different positions, at each of said different positions correction values that correct positional discrepancies in said height position of said bonding arm and limit values that limit said electric power are determined for a state in which no load is applied to said linear motor and for a state in which a weight is mounted on said supporting frame so that a load equal to a bonding load is applied to said linear motor, said correction values and limit values are stored in said computer, and said electric power for said linear motor is controlled according to said correction values and limit values during bonding, thus correcting said bonding load.

* * * * *

UNITED STATES PATENT AND TRADEMARK OFFICE
CERTIFICATE OF CORRECTION

PATENT NO. : 6,095,396　　　　　　　　　　　　　　　　　　　　Page 1 of 1
DATED : August 1, 2000
INVENTOR(S) : Kuniyuki Takahashi et al.

It is certified that error appears in the above-identified patent and that said Letters Patent is hereby corrected as shown below:

<u>Title page,</u>
Item [54], Title of Invention, change "Bonding Load Correction Method and Wire Bonding Apparatus" to -- BONDING LOAD CORRECTION METHOD FOR A WIRE BONDING APPARATUS --

<u>Claim 1,</u>
Line 6, after "downward", insert -- relative to said table --

Signed and Sealed this

Fifth Day of February, 2002

JAMES E. ROGAN
*Director of the United States Patent and Trademark Office*

*Attest:*

*Attesting Officer*